(12) United States Patent
Russell

(10) Patent No.: US 6,392,578 B1
(45) Date of Patent: May 21, 2002

(54) DIGITAL-TO-ANALOG CONVERTER AND A METHOD FOR FACILITATING OUTPUTTING OF AN ANALOG OUTPUT OF PREDETERMINED VALUE FROM THE DIGITAL-TO-ANALOG CONVERTER IN RESPONSE TO A DIGITAL INPUT CODE

(75) Inventor: Brian Keith Russell, Limerick (IR)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 09/552,911

(22) Filed: Apr. 20, 2000

(51) Int. Cl.$^7$ ................................................. H03M 1/66
(52) U.S. Cl. ...................................... 341/144; 341/126
(58) Field of Search ................................ 341/144, 126, 341/140, 118; 708/603; 381/318, 83; 370/503

(56) References Cited

U.S. PATENT DOCUMENTS

| | | | | |
|---|---|---|---|---|
| 4,064,396 A | * | 12/1977 | Panarello | 341/140 |
| 4,075,428 A | * | 2/1978 | Ghisler et al. | 370/503 |
| 4,159,524 A | * | 6/1979 | Schollmeier et al. | 708/603 |
| 4,614,934 A | * | 9/1986 | Kobayashi et al. | 341/144 |
| 5,208,596 A | * | 5/1993 | Dieterich | 341/144 |
| 5,276,739 A | * | 1/1994 | Krokstad et al. | 381/318 |
| 5,583,501 A | * | 12/1996 | Henrion et al. | 341/118 |
| 5,638,073 A | * | 6/1997 | Grotz et al. | 341/144 |
| 5,677,987 A | * | 10/1997 | Seki et al. | 381/83 |

* cited by examiner

Primary Examiner—Peguy Jeanpierre
Assistant Examiner—Jean Bruner Jeanclaude
(74) Attorney, Agent, or Firm—Wolf, Greenfield & Sacks, P.C.

(57) ABSTRACT

A resistive DAC (1) comprises a digital input port (2) and an analog output port (3) on which analog resistance output values are outputted in response to corresponding digital input codes on the input port (2). A decoding and control circuit (4) selects appropriate resistors (R1) to (RN) from a resistor chain (5) for providing the analog resistance output of the analog output port (3). A register (7) stores a transfer coefficient in binary code which can be read through the input port (2) and by which each digital input code should be multiplied in order to produce an analog resistance output of predetermined value. The transfer coefficient in the register (7) takes account of variations in internal circuit parameters which causes the analog resistance outputs on the output port (3) to be less than they would in an ideal resistive DAC.

18 Claims, 1 Drawing Sheet

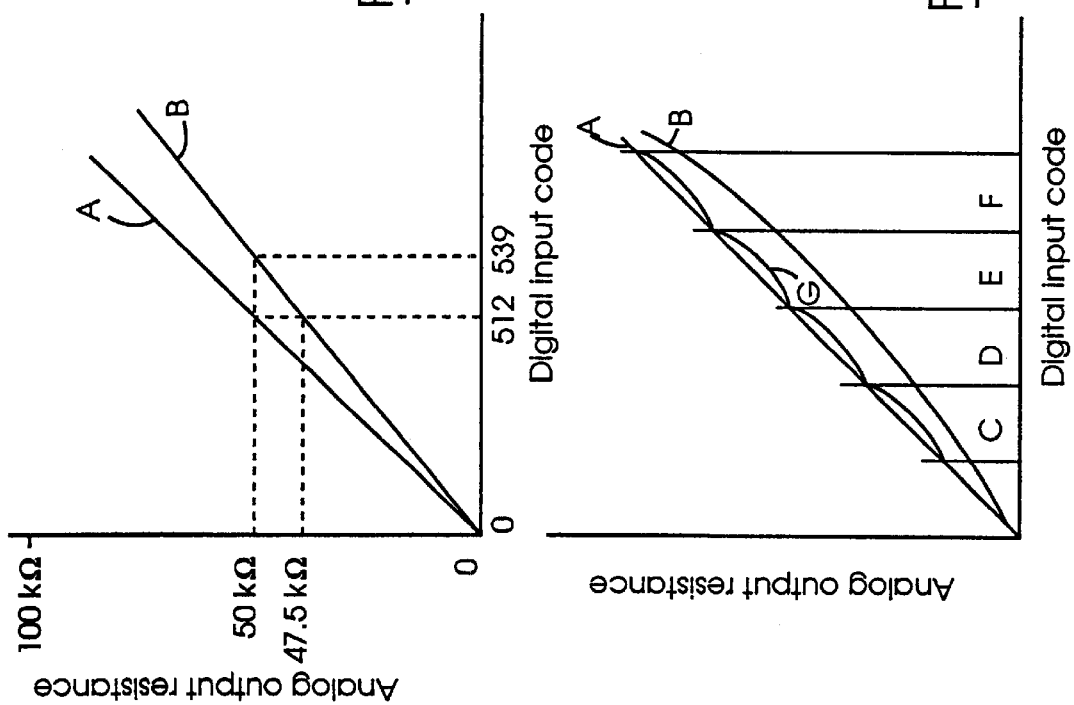
Fig. 2
Fig. 3
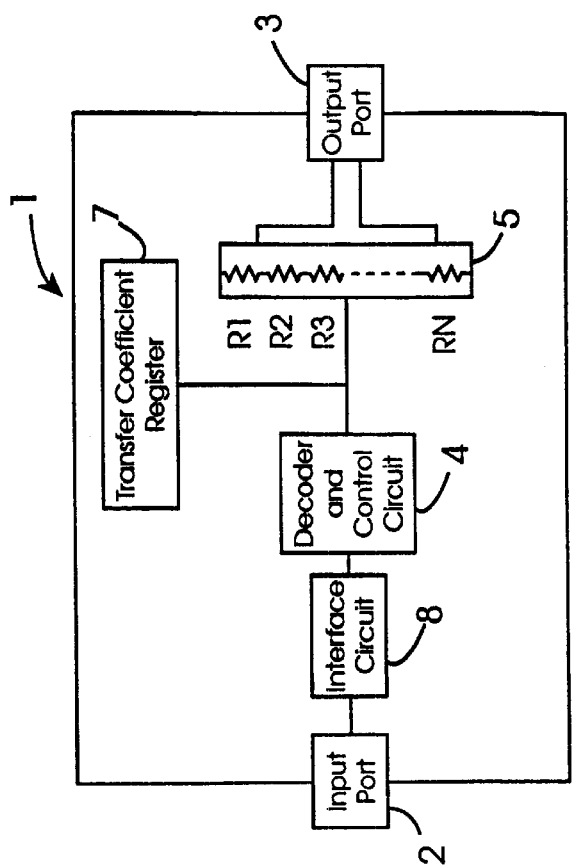
Fig. 1

DIGITAL-TO-ANALOG CONVERTER AND A METHOD FOR FACILITATING OUTPUTTING OF AN ANALOG OUTPUT OF PREDETERMINED VALUE FROM THE DIGITAL-TO-ANALOG CONVERTER IN RESPONSE TO A DIGITAL INPUT CODE

FIELD OF THE INVENTION

The present invention relates to a digital-to-analog converter and to a method for facilitating outputting of an analog output of predetermined value from the digital-to-analog converter in response to a digital input code.

BACKGROUND TO THE INVENTION

Digital-to-analog converters (DACs) which are formed as integrated circuits typically are formed by mass-production processes. In such mass-production processes, while it is possible to maintain the parameters of the internal circuits within such DACs substantially constant, nonetheless, drift from DAC to DAC in a mass production process does take place. Thus, a predetermined analog output value will not always result from a corresponding predetermined digital input code from one DAC to the next For example, the analog resistance output value of a resistive DAC for a given digital input code may vary from resistive DAC to resistive DAC due to drift in the production process. To put the problem another way, a known digital input code will not always produce the same analog resistance output value from one resistive DAC to the next. While in many applications for resistive DACs, this variation from DAC to DAC may be acceptable. However, in certain applications this variation is unacceptable. This is particularly so in cases where a resistive DAC is required to produce an analog resistance output of specific predetermined value for a predetermined digital input code, and in particular, where a resistive DAC is required to produce a range of analog resistance outputs of respective specific predetermined values for a corresponding range of predetermined digital input codes. Similar problems arise in respect of other DACs, for example, voltage DACs and current DACs.

There is therefore a need for a DAC which facilitates outputting of an analog output of predetermined value from a predetermined digital input code, and there is also a need for a method for facilitating the outputting of such an analog output of predetermined value from a DAC in response to a predetermined digital input code.

The present invention is directed towards providing such a DAC and a method.

SUMMARY OF THE INVENTION

According to the invention there is provided A DAC comprising:
  an input port for receiving a digital input code,
  an output port for outputting an analog output corresponding to a digital input code on the input port,
  a digit-to-analog converting means for converting digital input codes received from the input port to corresponding analog outputs for outputting on the output port,
  a storing means for storing a transfer coefficient of the DAC, the transfer coefficient being a function by which the digital input codes should be altered to produce respective corresponding analog outputs of respective predetermined values, and
  a communicating means for facilitating reading of the transfer coefficient from the storing means.

In one embodiment of the invention the transfer coefficient is a constant over a range of digital input codes. Preferably, the transfer coefficient is a constant for all digital input codes for which the DAC is adapted to receive.

In one embodiment of the invention the transfer coefficient is the function by which the respective digital input codes should be multiplied to produce the respective corresponding analog outputs of predetermined values.

Preferably, the transfer coefficient is stored as a digital code.

In one embodiment of the invention the communicating means communicates the storing means with the input port for facilitating reading of the transfer coefficient from the storing means by an external reading means through the input port. Ideally, the communicating means facilitates writing of the transfer coefficient to the storing means through the input port.

In one embodiment of the invention the DAC is a resistive DAC for providing analog resistance outputs in response to corresponding digital input codes.

In another embodiment of the invention the DAC is formed as an integrated circuit, and the storing means is formed in the integrated circuit.

In a further embodiment of the invention a plurality of transfer coefficients are stored the storing means, the transfer coefficients corresponding to respective segments of the range of digital input codes for which the DAC is adapted to receive, and the transfer coefficients being stored with their respective corresponding segments.

Additionally, the invention provides a method for facilitating outputting of an analog output of predetermined value from a DAC corresponding to a digital input code, the method comprising storing a transfer coefficient in the DAC, the transfer coefficient being a function by which digital input codes to the DAC should be altered to produce respective corresponding analog outputs of respective predetermined values, the transfer coefficient being stored so that it can be read and digital input codes to the DAC can be appropriately altered by the transfer coefficient to produce corresponding analog outputs of desired respective predetermined values.

In one embodiment of the invention the transfer coefficient is a constant over a range of digital input codes. Preferably, the transfer coefficient is a constant for all digital Input codes for which the DAC is adapted to receive.

In one embodiment of the invention the transfer coefficient is the function by which the respective digital input codes should be multiplied to produce the respective corresponding analog outputs of predetermined values.

Preferably, the transfer coefficient is stored as a digital code.

In another embodiment of the invention the method further comprises the step of writing the transfer coefficient to a storing means in the DAC.

Preferably, the method further comprises the step of determining the transfer coefficient by applying at least one digital input code of known value to the DAC which should produce an analog output of known predetermined value if the DAC were an ideal DAC, recording the actual value of the analog output produced by the known digital input code, and dividing the known predetermined value of the analog output which should have been produced by the known digital input code by the actual value of the analog output produced by the known digital input code, and the resulting value being thee transfer coefficient.

In one embodiment of the invention the transfer coefficient is determined by applying a plurality of digital codes of known values to the DAC, and recording the corresponding actual value of the analog outputs produced by the respective known digital input codes, and determining a plurality of transfer coefficients from the respective actual values of the analog outputs produced and their corresponding predetermined analog values, and determining the average transfer coefficient from the respective transfer coefficients, and storing the average transfer coefficient.

Alternatively, a plurality of transfer coefficients are determined for respective segments of the range of digital input codes which the DAC is adapted to receive, and the respective coefficients are stored together with the respective segments to which they correspond.

In another embodiment of the invention the DAC is formed as an integrated circuit, and a storing means for storing the transfer coefficient is formed in the integrated circuit.

ADVANTAGES OF THE INVENTION

The advantages of the invention are many. In particular, the DAC according to the invention permits analog outputs of predetermined values to be outputted in response to corresponding predetermined digital input codes. This is achieved by virtue of the fact that a transfer coefficient is determined for the DAC, and the transfer coefficient is stored in a storing means in the DAC, so that it can be read and the value of the predetermined digital input code which should produce the analog output of predetermined value can be altered by the transfer coefficient so that the analog output of the desired predetermined value is outputted from the DAC.

The invention will be more clearly understood from the following description of some preferred embodiments thereof which are given by way of example only with reference to the accompanying drawings.

BRIEF DESCRIPTION OF THE DRAWINGS

FIG. 1 is a block representation of a resistive DAC according to the invention,

FIG. 2 is a graphical representation of a plot of the output against the input of the DAC of FIG. 1 illustrating the actual and ideal outputs, and FIG. 3 is a graphical representation similar to that of FIG. 2 of a plot of the output against the input of another DAC according to the invention illustrating the actual and ideal outputs.

DETAILED DESCRIPTION OF A PREFERRED EMBODIMENT OF THE INVENTION

Referring to the drawings and initially to FIG. 1 there is illustrated an integrated circuit resistive DAC according to the invention indicated generally by the reference numeral 1. The DAC 1 is a ten bit DAC and comprises an input port 2 for receiving digital input codes, and an output port 3 on which analog resistance outputs are outputted in response to corresponding digital input codes applied to the input port 2. An analog-to-digital converting means comprising a decoding and a control circuit 4 is located in the DAC 1 for receiving and decoding digital input codes from the input port 2. A resistance chain 6 comprises a plurality of resistors R1 to RN which are selectable by the decoding and control circuit 4 for applying respective analog resistance outputs on the output port 3 in response to corresponding respective digital input codes on the input port 2. The arrangement and construction of such resistive DACs will be well known to those skilled in the art, and it is not intended to describe these aspects of the DAC 1 in further detail.

A storing means provided by a register 7 in the DAC 1 stores a transfer coefficient which can be read from the input port 2 through a communicating means, namely, through the decoding and control circuit 4 in response to a predetermined code being applied to the input port 2. The transfer coefficient is stored in the register 7 in binary code, and is a function as will be described below by which each digital input code should be multiplied in order to produce a corresponding analog resistance output on the output port 3 of predetermined resistance value corresponding to the digital input code. The determination and storing of the transfer coefficient is described below. An interface circuit 8 selectively configures the input port 2 as an input port for receiving digital input codes for in turn producing corresponding analog outputs on the output port a and for reading the transfer coefficient from the register 7 under the control of the decoding and control circuit 4 in response to the appropriate code being applied to the input port 2.

In this embodiment of the invention the DAC 1 should produce an analog resistance output of up to 100 KOhms in one thousand and twenty four incremental steps of 98 Ohms each. However, because of variations in the parameters of the internal circuitry of the DAC 1 from one DAC to another, in this particular DAC 1 the maximum resistance output which can be achieved is approximately 95 KOhms. Therefore, the transfer coefficient of this DAC 1 is 1.053. In other words, the transfer coefficient is equal to:

the predetermined ideal value of the analog output/the actual value of the analog output for any corresponding predetermined digital input code.

That is 100/98=1.053.

Accordingly, by virtue of the fact that the actual maximum value of the resistance of the analog output of the DAC 1 is 95 KOhms as opposed to the ideal value of 100 KOhms, each incremental step of analog output resistance instead of being 98 Ohms is approximately 93 Ohms. By multiplying the respective digital input codes which should produce corresponding analog outputs of predetermined ideal resistance values by the transfer coefficient the actual resistance values of the analog output are the desired predetermined ideal resistance values.

Referring in particular to FIG. 2 graph A illustrates the relationship between the ideal resistance output values and digital input codes which should produce the ideal resistance values over the operational range of resistance values and digital input codes of the DAC 1. The digital codes range from 000 hex (0 decimal) to 3ff hex (1024 decimal), while the range of resistance values ranges from 0 KOhms to 100 KOhms. Graph B illustrates the relationship between the actual analog resistance output values and the corresponding digital input codes over the same range of digital input codes for the DAC 1. Graphs A and E are straight line graphs, thus illustrating a linear relationship. As can be seen from the two graphs the actual resistance output values are below the ideal resistance values for each digital input code. Accordingly, by multiplying the respective digital input codes by the transfer coefficient of 1.053 stored in the register 7 analog outputs of resistance values corresponding to the predetermined ideal resistance values are produced. For example, from the ideal graph A the digital code of 512 (decimal) should produce an analog resistance output value of 50 KOhms, however, from the actual graph B it can be seen that the digital input code 512 (decimal) produces an analog output resistance value of 47.5 KOhms. By multiplying the digital input code of 512

(decimal) by the transfer coefficient of 1.053 the actual input code of 539 (decimal) which is required to produce an actual resistance value of 50 KOhms on the analog output is obtained. Accordingly, a user wishing to set the DAC 1 to produce a specific analog resistance output value reads the transfer coefficient from the register 7, and multiplies the digital input code which should produce the specific resistance output value if the DAC 1 were an ideal DAC by the transfer coefficient in order to give a digital input code which will produce the specific predetermined analog output resistance value on the output port 3.

The method for determining the transfer coefficient of each DAC 1 of a batch of DACs 1 is as follows. A known digital input code which should produce a predetermined ideal analog output resistance value is applied to the input port 2. The actual value of the analog resistance output on the output port 3 resulting from the known digital input code is recorded, and the ideal value of the analog resistance output which should have been produced had the DAC 1 been an ideal DAC is divided by the actual value of analog resistance produced by the known digital input code, and the result which is the transfer coefficient is then entered into register 7. An appropriate code is initially entered through the input port 2 for configuring the input port 2 to receive the transfer coefficient and for transferring the transfer coefficient to the register 7. When the input port 2 is so configured the transfer coefficient is then entered through the input port 2 into the register 7. A further appropriate code is entered through the input port 2 for configuring the input port 2 to receive digital input codes for producing corresponding analog resistance output values so that the DAC 1 can operate as a digital-to-analog converter.

A user wishing to read the transfer coefficient from the register 7 enters another appropriate code through the input port 2 for configuring the input port 2 for facilitating reading of the transfer coefficient through the input port 2 from the register 7. After the transfer coefficient has been read from the register 7 another appropriate code is entered through the input port 2 for reconfiguring the input port 2 so that the digital-to-analog converter 1 acts as a DAC. The entry of such appropriate codes for configuring an input port 2 to fulfill different functions will be well known to those skilled in the art. The user then multiplies the digital input code which under ideal conditions would produce a desired analog resistance output value by the transfer coefficient, and the new digital input code is then applied to the input port 2.

In general, over the normal operating range of resistance values and digital input codes of the DAC 1 the relationship between the analog resistance outputs and the corresponding digital input codes for both ideal and actual values should be substantially linear, and accordingly, the transfer coefficient determined for one digital input code should hold good for all digital input codes over the normal operating range of the DAC 1. However, it is envisaged in certain cases that a number of determinations of transfer coefficient may be made for different values of distal input codes and analog resistance output values, and the average of the values of transfer coefficients would be computed and stored in the register 7.

Referring now to FIG. 3 there is illustrated graphs A and B similar to the graphs A and B of FIG. 2 produced from a resistive DAC also according to the invention which is substantially similar to the DAC 1 described with reference to FIGS. 1 and 2. Graph A which illustrates the relationship between the analog resistance output values and the digital input codes if the DAC according to this embodiment of the invention were an ideal DAC shows a linear relationship between the analog resistance output values and the digital input codes. However, in the DAC according to this embodiment of the invention the relationship between the actual resistance values of the analog output and the digital input codes, graph B, is not a linear relationship. Accordingly, to overcome the lack of linearity in the relationship the operating range of the DAC is divided into four segments, namely, segments C, D, E and F. A transfer coefficient is computed for each segment C, D, E and F of the operating range, and the respective four transfer coefficients are entered and stored in four registers similar to the register 7 against the segments C, D, E and F to which they relate. Accordingly, a user determines the segment of the operating range in which it is desired that the DAC should operate and reads the appropriate transfer coefficient from the appropriate register through the input port as already described with reference to the DAC 1. The computation of the coefficients for the respective segments C, D, E and F is carried out as already described. Additionally, by virtue of the fact that the graph A is non-linear a plurality of transfer coefficients may be computed for different digital input codes for each segment C, D, E and F and the average transfer coefficient would be determined for each specific segment C, D, E and F and the respective average transfer coefficients for the respective segments C, D, E and F would thus be stored in the register 7.

The graph G in FIG. 3 illustrates the actual values of the analog resistance outputs which are outputted from the DAC according to this embodiment of the invention as a result of multiplying the digital input codes by the respective transfer coefficient of the corresponding segments C, D, E and F over the operating range of the DAC.

While the DACs according to the invention have been described with reference to FIGS. 1 to 3 as being resistive DACs, it will be readily apparent to those skilled in the art that the DACs may be any other DAC, for example, a voltage DAC or a current DAC.

It is also envisaged that while the DACs have been described as being ten bit resistive DACs with a maximum resistance output of 100 KOhms, the DACs may be provided to produce an analog resistance output of any desired maximum value, and may be an eight bit, four bit, or indeed may be DACs with an input having any desired number of bits.

It is envisaged that test apparatus will be provided for testing the DACs and for determining the transfer coefficients of the DACs. The test apparatus would also have a facility for writing the transfer coefficient to the registers in the respective DACs.

Additionally, it is envisaged that a computing means may also be provided on the DAC. For example, in the decoding and control circuit 4 for automatically appropriately altering the digital input code applied to the input port 2 by the appropriate transfer coefficient, in this case automatically multiplying the digital input code applied to the input port 2 by the transfer coefficient. In which case, it would not be necessary to provide a facility for reading the transfer coefficient from the register 7, since the digital input code would be automatically multiplied by the transfer coefficient, thereby eliminating the need for a user to read the transfer coefficient and to multiply the digital input code by the transfer coefficient in order to produce a desired predetermined analog resistance output from the DAC.

What is claimed is:

1. A DAC comprising:
   an input port for receiving a digital input code, an output port for outputting an analog output corresponding to a digital input code on the input port, a digital-to-analog converting means for converting digital input codes received from the input port to corresponding analog outputs for outputting on the output port, a storing means for storing a transfer coefficient of the DAC, the transfer coefficient being a function by which the digital input codes are altered to produce respective corresponding analog outputs of respective predetermined values, and a communicating means for facilitating reading of the transfer coefficient from the storing means.

2. A DAC as claimed in claim 1 in which the transfer coefficient is a constant over a range of digital input codes.

3. A DAC as claimed in claim 1 in which the transfer coefficient is the function by which the respective digital input codes are multiplied to produce the respective corresponding analog outputs of predetermined values.

4. A DAC as claimed in claim 1 in which a plurality of transfer coefficients are stored in the storing means, the transfer coefficients corresponding to respective segments of the range of digital input codes, and being stored with their respective corresponding segments.

5. A DAC as claimed in claim 1 in which the transfer coefficient is stored as a digital code.

6. A DAC as claimed in claim 1 in which the communicating means communicates the storing means with the input port for facilitating reading of the transfer coefficient from the storing means by an external reading means through the input port.

7. A DAC as claimed in claim 1 in which the communicating means facilitates writing of the transfer coefficient to the storing means through the input port.

8. A DAC as claimed in claim 1 in which the DAC is a resistive DAC for providing analog resistance outputs in response to corresponding digital input codes.

9. A DAC as claimed in claim 1 in which the DAC is formed as an integrated circuit and the storing means is formed in the integrated circuit.

10. A method for facilitating outputting of an analog output of predetermined value from a DAC corresponding to a digital input code, the method comprising storing a transfer coefficient in the DAC, the transfer coefficient being a function by which digital input codes to the DAC are altered to produce respective corresponding analog outputs of respective predetermined values, the transfer coefficient being stored so that it is read and digital input codes to the DAC are appropriately altered by the transfer coefficient to produce corresponding analog outputs of desired respective predetermined values.

11. A method as claimed in claim 10 in which the transfer coefficient is the function by which the respective digital input codes are multiplied to produce the respective corresponding analog outputs of predetermined values.

12. A method as claimed in claim 11 in which the transfer coefficient is a constant over a range of digital input codes.

13. A method as claimed in claim 10 in which the transfer coefficient is stored as a digital code.

14. A method as claimed in claim 10 in which the method further comprises the step of writing the transfer coefficient to a storing means in the DAC.

15. A method as claimed in claim 14 in which the DAC is formed as an integrated circuit, and the storing means for storing the transfer coefficient is formed in the integrated circuit.

16. A method as claimed in claim 10 in which the method further comprises the step of determining the transfer coefficient by applying at least one digital input code of known value to the DAC for producing an analog output of known predetermined value if the DAC were an ideal DAC, recording the actual value of the analog output produced by the known digital input code, and dividing the known predetermined value of the analog output by the actual value of the analog output produced by the known digital input code, the resulting value being the transfer coefficient.

17. A method as claimed in claim 16 in which the transfer coefficient is determined by applying a plurality of digital codes of known values to the DAC, and recording the corresponding actual value of the analog outputs produced by the respective known digital input codes, and determining a plurality of transfer coefficients from the respective actual values of the analog outputs produced and their corresponding predetermined analog values, and determining the average transfer coefficient from the respective transfer coefficients, and storing the average transfer coefficient.

18. A method as claimed in claim 16 in which a plurality of transfer coefficients are determined for respective segments of the range of digital input codes, the respective coefficients being stored together with the respective segments to which they correspond.

* * * * *